(12) United States Patent
Nozokido

(10) Patent No.: US 10,033,344 B2
(45) Date of Patent: Jul. 24, 2018

(54) DIGITAL SIGNAL PROCESSOR AND AUDIO DEVICE

(71) Applicant: ZOOM CORPORATION, Tokyo (JP)

(72) Inventor: Michihito Nozokido, Tokyo (JP)

(73) Assignee: ZOOM CORPORATION, Tokyo (JP)

( * ) Notice: Subject to any disclaimer, the term of this patent is extended or adjusted under 35 U.S.C. 154(b) by 4 days.

(21) Appl. No.: 15/162,877

(22) Filed: May 24, 2016

(65) Prior Publication Data

US 2016/0352300 A1 Dec. 1, 2016

(30) Foreign Application Priority Data

May 29, 2015 (JP) ................................ 2015-110138

(51) Int. Cl.
| | |
|---|---|
| *H04B 15/00* | (2006.01) |
| *H03G 11/00* | (2006.01) |
| *H03M 1/06* | (2006.01) |
| *H03F 3/183* | (2006.01) |
| *H03G 7/00* | (2006.01) |
| *H03M 1/18* | (2006.01) |

(52) U.S. Cl.
CPC ........... *H03G 11/008* (2013.01); *H03F 3/183* (2013.01); *H03G 7/007* (2013.01); *H03M 1/0614* (2013.01); *H03M 1/185* (2013.01); *H03F 2200/03* (2013.01)

(58) Field of Classification Search
CPC ... H03F 3/183; H03F 2200/03; H03G 11/008; H03G 7/007; H03M 1/0614; H03M 1/185
USPC ........................................................ 381/94.8
See application file for complete search history.

(56) References Cited

U.S. PATENT DOCUMENTS

| | | | | |
|---|---|---|---|---|
| 5,677,962 A * | 10/1997 | Harrison | ................ | H03G 3/001 330/278 |
| 5,821,889 A * | 10/1998 | Miller | ................... | H03M 1/185 341/139 |
| 6,396,933 B1 * | 5/2002 | Jung | ........................ | A61B 7/04 181/131 |
| 8,036,402 B2 * | 10/2011 | Furge | ....................... | H03F 1/32 330/135 |

(Continued)

FOREIGN PATENT DOCUMENTS

| | | |
|---|---|---|
| JP | 644638 A | 2/1994 |
| JP | 201478298 A | 5/2014 |

*Primary Examiner* — Hemant Patel
(74) *Attorney, Agent, or Firm* — The Webb Law Firm

(57) ABSTRACT

A digital signal processor that is capable of suppressing a signal level of an input analog signal at not more than the maximum voltage for A/D conversion and capable of preventing distortion of an A/D converted digital signal while maintaining a good S/N ratio. The digital signal processor 2 of the present invention includes amplification factor setting mechanisms to set amplification factors of the analog amplifiers to second amplification factors lower than first amplification factors specified by amplification factor adjustment knobs, digital amplifier mechanisms to amplify A/D converted digital signals by third amplification factors lower than the first amplification factors, and digital limiter mechanisms to compare the signal levels of the digital signals amplified by the third amplification factors with a threshold defined in advance and attenuate the digital signals within the range of the third amplification factors based on a result of the comparison.

5 Claims, 6 Drawing Sheets

(56) References Cited

U.S. PATENT DOCUMENTS

| | | | |
|---|---|---|---|
| 9,646,586 B2* | 5/2017 | Shirai | G10H 1/0091 |
| 2014/0098651 A1* | 4/2014 | Adachi | G11B 20/10314 369/4 |

* cited by examiner

DIGITAL SIGNAL PROCESSOR AND AUDIO DEVICE

CROSS-REFERENCE TO RELATED APPLICATION

This application claims priority to Japanese Patent Application No. 2015-110138 filed May 29, 2015, the disclosure of which is hereby incorporated in its entirety by reference.

TECHNICAL FIELD

The present invention relates to a digital signal processor for processing a sound signal (DSP) and an audio device having the same mounted thereto. In particular, the present invention relates to a digital signal processor and an audio device that are capable of preventing distortion of an A/D converted digital signal while maintaining a good S/N ratio.

BACKGROUND ART

<Distortion of Digital Signal>

There are known audio devices for processing sound signals, such as digital audio recorders, digital mixers, and effects units, for example. To such audio device, an analog sound signal is input via a microphone or an input terminal. The analog signal input to the audio device is amplified by an analog amplifier, followed by conversion to a digital signal. The amplification factor of the analog amplifier is set by a user by manually operating an operation unit provided in the audio device.

As illustrated in FIG. 7, an A/D converter of the audio device has the maximum voltage for A/D conversion (for example, "5.0 V") defined in advance. When the amplification factor of the analog amplifier is too large relative to the signal level (that is, volume) of the analog signal input to the audio device, the signal level of the amplified analog signal sometimes exceeds the maximum voltage for A/D conversion (refer to a signal waveform on the left in FIG. 7). In such a case, the parts exceeding the maximum voltage for A/D conversion of the amplified analog signal are truncated without A/D conversion. As a result, the continuous analog signal is converted to a discontinuously distorted digital signal (refer to a signal waveform on the right in FIG. 7). The distortion of the digital signal becomes unrestorable noise. In recording and music performance, unexpected excessive input occurs often. By incorrectly setting the amplification factor of the analog amplifier, noise is generated when excessive input occurs.

<Limiter Circuit>

Some conventional audio devices are provided with a limiter circuit as a measure to the excessive input. As illustrated in FIG. 8, when excessive input occurs, the limiter circuit performs limiter processing to instantaneously reduce the amplification factor of the analog amplifier. As the conventional limiter circuit, there are those using, for example, a VCA (voltage controlled amplifier) or a photoresistor.

Such VCA is an amplifier having input and output of analog signals and input of the control voltage. The limiter circuit using the VCA outputs a control voltage in accordance with the signal level of the analog signal to the VCA. The VCA changes the amplification factor of the analog signal based on the input control voltage.

The photoresistor is a cadmium sulfide cell and changes the resistance value in accordance with the amount of received light. The limiter circuit using the photoresistor is provided with an LED as a light emitting unit. Such LED is turned on when excessive input occurs. The photoresistor decreases the resistance value by receiving light from the LED. The decrease in the resistance value of the photoresistor changes the amplification factor of the analog amplifier.

<Backup Function>

Some conventional digital audio recorders are provided with a backup function in which one analog signal is amplified by two amplification factors to be stored individually. The conventional backup function is achieved by providing two signal paths to input one analog signal. The two signal paths are connected to respective analog amplifiers. The analog amplifier connected to one of the signal paths amplifies the analog signal by one amplification factor, which is a value set by a user. The analog amplifier connected to the other signal path amplifies the analog signal by the other amplification factor, which is a value lower than the user's setting. The one amplification factor is set by a user by operating an amplification factor adjustment knob. Meanwhile, the other amplification factor is set by a user by calling a setting screen on a display panel by inputting a value on the setting screen.

PRIOR ART DOCUMENTS

Patent Document

Patent Document 1: Japanese Patent Application Kokai Publication No. 2014-78298

Patent Document 2: Japanese Patent Application Kokai Publication No. 2012-58704

Patent Document 3: Japanese Patent Application Kokai Publication No. H06-44638

DISCLOSURE OF THE INVENTION

Problems to be Solved by the Invention

However, the VCA is a large-scale circuit composed of many electrical components, such as capacitors, diodes, a transistor, operational amplifiers, and resistors. Therefore, noise is added to the analog signal having passed through the VCA and a good S/N (signal/noise) ratio is not obtained. In addition, such VCA with many components requires a lot of time and costs for circuit manufacture.

Meanwhile, the photoresistor is a cadmium sulfide cell. Therefore, sales of audio devices having a photoresistor are currently not allowed in EU countries by the RoHS directive effective in July 2006. At present, there is no substitute for a photoresistor and there is no alternative but to apply a limiter circuit using a VCA to audio devices for sales in EU countries.

In addition, in conventional digital audio recorders, the amplification factor of the other analog amplifier for backup has to be set on a setting screen of a display panel in advance. Therefore, a user cannot modify the setting of the amplification factor of the other analog amplifier in accordance with the recording situation. Further, a digital signal processor provided in such conventional digital audio recorder is configured to perform identical digital processing to two A/D converted digital signals. In other words, the backup function in the conventional digital audio recorders is nothing more than giving a difference between the amplification factors of the two analog amplifiers and is not capable of various types of adjustment for sound signals.

The present invention has been made in view of the above conventional problems. It is a first object of the present invention to provide a digital signal processor and an audio device that are capable of suppressing a signal level of an input analog signal at not more than the maximum voltage for A/D conversion and capable of preventing distortion of an A/D converted digital signal while maintaining a good S/N ratio.

It is a second object of the present invention to provide an audio device provided with a backup function that is capable of performing, to one analog signal, control of amplification factors of two or more analog amplifiers and processing of each digital signal converted by two or more A/D converters and further capable of performing adjustment for such control and processing individually for each of two or more signal paths.

Means to Solve the Problems (1) To achieve the above objects, a digital signal processor of the present invention is a digital signal processor performing control of an amplification factor of an analog amplifier to amplify an analog sound signal and processing of a digital signal obtained by A/D conversion of the analog signal, the processor configured to include: an amplification factor setting mechanism to set the amplification factor of the analog amplifier to a second amplification factor lower than a first amplification factor specified by an operation unit; a digital amplifier mechanism to amplify the A/D converted digital signal by a third amplification factor lower than the first amplification factor; and a digital limiter mechanism to compare a signal level of the digital signal amplified by the third amplification factor with a threshold defined in advance and attenuate the digital signal within a range of the third amplification factor based on a result of the comparison.

(2) Preferably, the digital signal processor according to (1) above is configured that the third amplification factor is a value obtained by subtracting the second amplification factor from the first amplification factor.

(3) Preferably, the digital signal processor according to (1) or (2) above is configured that the third amplification factor is lower than the second amplification factor.

(4) To achieve the above objects, an audio device of the present invention is an audio device configured to include: a signal input unit to input an analog sound signal; an analog amplifier to amplify the analog signal; an operation unit to specify a first amplification factor of the analog amplifier; an A/D converter to convert the analog signal amplified by the analog amplifier to a digital signal; and the digital signal processor according to any of (1) through (3) above to perform control of the amplification factor of the analog amplifier and processing of the digital signal converted by the A/D converter.

(5) Preferably, the audio device according to (4) above may be configured to further include: a storage mechanism to store digital data of the digital signal processed by the digital signal processor; or a connection unit to the storage mechanism.

(6) Preferably, the audio device according to (4) or (5) above is configured that a plurality of the analog amplifiers, the operation units, and the A/D converters are connected to the one signal input unit, and based on two or more of the first amplification factors specified by the plurality of operation units, the digital signal processor performs control of the amplification factors of two or more of the analog amplifiers and processing of each digital signal converted by two or more of the A/D converters.

(7) Preferably, the audio device according to (6) above may be configured to further include a plurality of signal paths respectively including the signal input units, the analog amplifiers, the operation units, and the A/D converters, wherein, to the signal input unit of one of the signal paths, the analog amplifier, the operation unit, and the A/D converter of another signal path are selectively connected, and based on two of the first amplification factors specified by the operation units of the one and another signal paths, the digital signal processor performs control of the amplification factor of each analog amplifier of the one and another signal paths and processing two of the digital signals converted by the respective A/D converters of the one and another signal paths.

Effects of the Invention

According to the digital signal processor and the audio device of the present invention, it is possible to suppress a signal level of an input analog signal at not more than the maximum voltage for A/D conversion and to prevent distortion of an A/D converted digital signal while maintaining a good S/N ratio.

In addition, according to the audio device of the present invention, it is possible to provide a backup function that is capable of performing, to one analog signal, control of amplification factors of two or more analog amplifiers and processing of each digital signal converted by two or more A/D converters and further capable of performing adjustment for such control and processing individually for each of two or more signal paths.

MODES FOR CARRYING OUT THE INVENTION

Descriptions are given below to an audio device provided with a digital signal processor according to an embodiment of the present invention with reference to the drawings.

<External Configuration>

FIGS. 1A-1D illustrate the external configuration of an audio device 1 in the present embodiment. The audio device 1 in the present embodiment is a digital audio recorder. However, the digital audio recorder is an example of the audio device of the present invention. The audio device of the present invention is not limited to the digital audio recorder and is widely applicable to audio devices for processing sound signals, such as digital audio recorders, digital mixers, and effects units, for example.

Figure 1C:
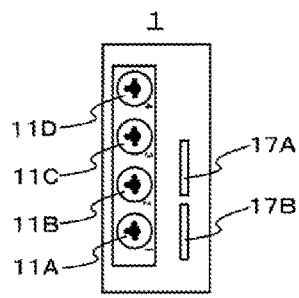
FIG. 1C is a left side view of an external configuration of an audio device provided with a digital signal processor according to an embodiment of the present invention

The audio device 1 in the present embodiment has a configuration capable of recording sound in eight channels. As illustrated in FIG. 1C, the audio device 1 has a left side provided with four signal input units 11A through 11D. Meanwhile, as illustrated in FIG. 1D, the audio device 1 also has a right side provided with four signal input units 11E through 11H. The eight signal input units 11A through 11H are connected to, for example, a microphone, not shown, or musical instruments, such as guitars, bass guitars, and keyboards. The analog sound signals input from the signal input units 11A through 11H are output respectively to eight signal paths illustrated in FIG. 2.

As illustrated in FIG. 1C, the left side of the audio device 1 is provided with two card slots (connection units) 17a and 17b. The card slots 17a and 17b permits insertion of an SD memory card 35 (storage mechanism) illustrated in FIG. 2. The storage mechanism of the audio device 1 is not limited to the SD memory card 35. To the audio device 1, various internal and external data media that are capable of storing digital data are applicable.

Figure 1B:
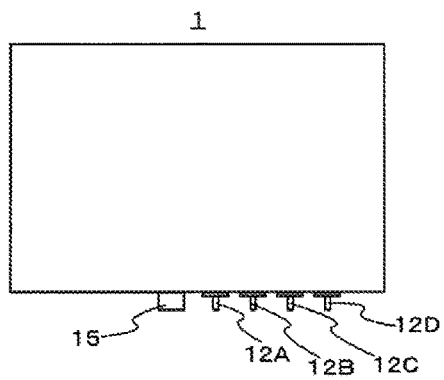
FIG. 1B is a plan view of an external configuration of an audio device provided with a digital signal processor according to an embodiment of the present invention
Figure 1D:
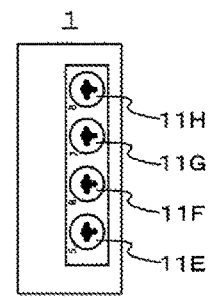
FIG. 1D is a right side view of an external configuration of an audio device provided with a digital signal processor according to an embodiment of the present invention.
Figure 1A:
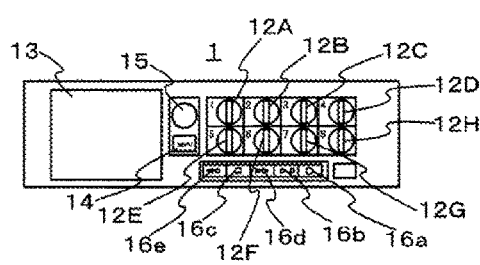
FIG. 1A is a front view of an external configuration of an audio device provided with a digital signal processor according to an embodiment of the present invention.

As illustrated in FIGS. 1A and 1B, the audio device 1 has a front provided with an operation unit and a display unit to perform setting, recording, and play. Eight amplification factor adjustment knobs (operation units) 12A through 12H are for a user to individually specify the respective amplification factors of the analog sound signals input from the signal input units 11A through 11H. In the present embodiment, the amplification factors specified by the amplification factor adjustment knobs 12A through 12H are referred to as "first amplification factors". The numerical range of first amplification factors is not particularly limited. The audio device 1 in the present embodiment is capable of specifying the first amplification factors within a range, for example, from +10 dB to +75 dB by operating the amplification factor adjustment knobs 12A through 12H.

A display panel 13 displays information on setting, recording, play, and the like. As the display panel 13, a liquid crystal display or an organic EL display, for example, may be used. A menu button 14 causes a setting menu to be displayed on the display panel 13. A selection/determination knob 15 is to perform selection and determination of setting items displayed on the display panel 13. The selection/determination knob 15 has a configuration capable of, for example, rotary operation and pressing operation. Any of the setting items displayed on the display panel 13 is selected by a user by a rotary operation of the selection/determination knob 15. The selection of the setting item is determined by a user by a pressing operation of the selection/determination knob 15.

A recording button 16a is to cause the audio device 1 to perform control process for recording. The recording in this context means that digital data of a digital signal obtained by A/D conversion from an analog sound signal is stored in the SD memory card 35.

A play/pause button 16b is to cause the audio device 1 to perform control process for play and pause of play or recording of digital data stored in the SD memory card 35. The play in this context means that digital data stored in the SD memory card 35 is read out.

When the play/pause button 16b is operated, the audio device 1 reads digital data stored in the SD memory card 35 and outputs a digital sound signal. When the play/pause button 16b is operated during readout of digital data, the audio device 1 stops the readout of the digital data. Further, when the play/pause button 16b is operated during storage of digital data, the audio device 1 stops the storage of the digital data.

A stop button 16c is to cause the audio device 1 to stop control process for recording, play, and the like. A fast forward button 16d is to cause the audio device 1 to fast forward readout of digital data. A fast rewind button 16e is to cause the audio device 1 to fast rewind readout of digital data.

<Circuit Configuration>

Then, a characteristic circuit configuration of the audio device 1 in the present embodiment is described with reference to FIG. 2. As indicated by the numbers from "1" to "8" in FIG. 2, the audio device 1 has eight signal paths corresponding to the respective signal input units 11A through 11H. The signal paths "1" through "8" are connected to each one of analog amplifiers 21A through 21H and A/D converters 22A through 22H. All of the eight A/D converters 22A through 22H are connected to a digital signal processor (DSP) 2. Respective digital signals converted by the A/D converters 22A through 22H are digitally processed by the digital signal processor 2.

The analog amplifiers 21A through 21H amplify analog sound signals input to the signal input units 11A through 11H by analog circuits. The analog signals amplified by the analog amplifiers 21A through 21H are output to the A/D converters 22A through 22H.

The A/D converters 22A through 22H A/D convert the analog signals amplified by the analog amplifiers 21A through 21H. The digital signals A/D converted by the A/D converters 22A through 22H are output to the digital signal processor 2.

The digital signal processor 2 is provided with amplification factor setting mechanisms 31A through 31H, digital amplifiers 32A through 32H, and digital limiter mechanisms 33A through 33H. All of the amplification factor setting mechanisms 31A through 31H, the digital amplifiers 32A through 32H, and the digital limiter mechanisms 33A through 33H are digital signal processing functions of the digital signal processor 2 performed based on a computer program.

The amplification factor setting mechanisms 31A through 31H correspond respective to the eight amplification factor adjustment knobs 12A through 12H and the eight analog amplifiers 21A through 21H. The amplification factor setting mechanisms 31A through 31H monitor values of the first amplification factors specified by the amplification factor adjustment knobs 12A through 12H. The amplification factor setting mechanisms 31A through 31H then set amplification factors of the analog amplifiers 21A through 21H based on the values of the first amplification factors. In the present embodiment, the amplification factors of the analog amplifiers 21A through 21H set by the amplification factor setting mechanisms 31A through 31H are referred to as "second amplification factors". The process by the amplification factor setting mechanisms 31A through 31H is described later in detail.

The digital amplifiers 32A through 32H correspond respective to the eight A/D converters 22A through 22H. The digital amplifiers 32A through 32H amplify digital signals output from the A/D converters 22A through 22H by digital signal processing. Predetermined amplification factors are set as the A/D converters 22A through 22H in advance. In this embodiment, the predetermined amplification factors set to the digital amplifiers 32A through 32H are referred to as "third amplification factors". The digital signals amplified by the digital amplifiers 32A through 32H are output to the digital limiter mechanisms 33A through 33H. The process by the digital amplifiers 32A through 32H is described later in detail.

The digital limiter mechanisms 33A through 33H limiter process the digital signals amplified by the digital amplifiers 32A through 32H. That is, when a signal level of a digital signal amplified by the third amplification factor is excessive, the digital limiter mechanisms 33A through 33H attenuate the digital signal by digital signal processing. The digital signals output from the digital limiter mechanisms 33A through 33H are stored in a storage mechanism, such as the SD memory card 35, for example. The process by the digital limiter mechanisms 33A through 33H is described later in detail.

<Amplification Processing>

Then, signal amplification processing in the audio device 1 in the present embodiment is described with reference to FIGS. 1A-3. For simplification of description on the amplification processing, the description below is given to amplification processing by the signal path "1" corresponding to the one signal input unit 11A out of the eight signal input units 11A through 11H. In the signal paths "2" through "8" corresponding to the other signal input units 11B through 11H, amplification processing same as the description below is performed.

Figure 2:
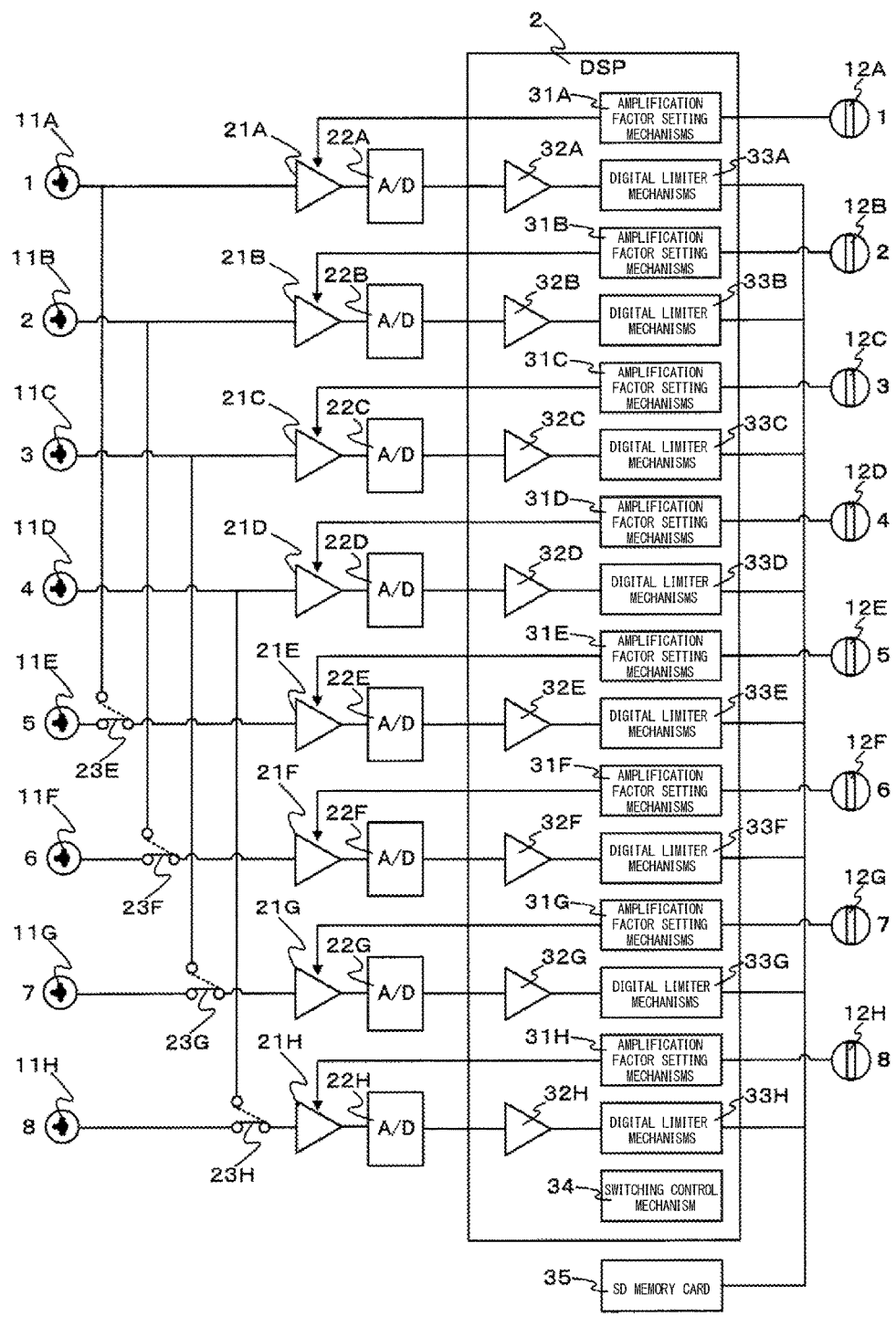
FIG. 2 is a block diagram illustrating a circuit of the audio device in the present embodiment.

In FIGS. 1A-2, the signal input unit 11A is connected to a microphone or a musical instrument, such as a guitar, a bass guitar, and a keyboard, for example. A user of the audio device 1 specifies the first amplification factor, for example, within a range from +10 dB to +75 dB by operating the amplification factor adjustment knob 12A. In the present embodiment, a user is assumed to specify "+55 dB" as the value of the first amplification factor.

Figure 3:
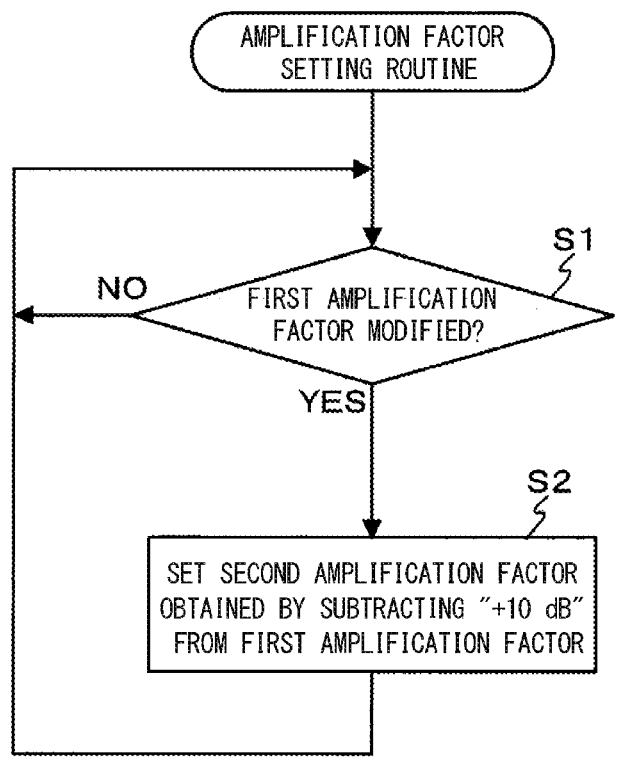
FIG. 3 is a flow chart illustrating an amplification factor setting routine performed by the digital signal processor in the present embodiment.

The amplification factor setting mechanism 31A performs an amplification factor setting routine illustrated in FIG. 3. When the audio device 1 is powered on to activate a system, the amplification factor setting mechanism 31A determines whether or not the value of the first amplification factor is modified (step S1). In other words, the amplification factor setting mechanism 31A monitors the value of the first amplification factor specified by the amplification factor adjustment knob 12A to determine whether or not the current value of the first amplification factor is modified from the value of the first amplification factor specified in the past.

In step S1, when the value of the first amplification factor is determined to be modified ("YES" in step S1), the amplification factor setting mechanism 31A performs the process in step S2. That is, the amplification factor setting mechanism 31A sets a value lower than the modified value of the first amplification factor as a second amplification factor of the analog amplifier 21A. In the present embodiment, the amplification factor setting mechanism 31A is assumed to set a value, for example, obtained by subtracting "+10 dB" from the first amplification factor as the second amplification factor of the analog amplifier 21A. Accordingly, the amplification factor setting mechanism 31A sets "+45 dB" obtained by subtracting "+10 dB" from the value "+55 dB" of the first amplification factor specified by a user as the second amplification factor of the analog amplifier 21A. As a result, the analog amplifier 21A amplifies the analog sound signal input from the signal input unit 11A not by the first amplification factor "+55 dB" specified by a user but by the second amplification factor "+45 dB" lower than that. After that, the amplification factor setting mechanism 31A repeats the determination in step S1 to monitor modification of the value of the first amplification factor specified by the amplification factor adjustment knob 12A.

In contrast, when the value of the first amplification factor is determined not to be modified ("NO" in step S1), the amplification factor setting mechanism 31A repeats the determination in step S1 to monitor modification of the value of the first amplification factor specified by the amplification factor adjustment knob 12A.

Subsequently, as illustrated in FIG. 2, the analog signal amplified by the second amplification factor is A/D converted by the A/D converter 22A. The A/D converted digital signal is output to the digital signal processor 2. The digital amplifier 32A of the digital signal processor 2 amplifies the digital signal output from the A/D converter 22A by a third amplification factor that is set in advance by the digital signal process. In the present embodiment, the value of the third amplification factor is, for example, "+10 dB". The sum of the second amplification factor "+45 dB" and the third amplification factor "+10 dB" thus coincides with the first amplification factor "+55 dB" specified by a user. That is, the audio device 1 in the present embodiment splits the first amplification factor "+55 dB" specified by a user into the second amplification factor "+45 dB" for analog signal process and the third amplification factor "+10 dB" for digital signal process. The third amplification factor "+10 dB" for digital signal process is then utilized for limiter processing by the digital limiter mechanisms 33A through 33H.

<Limiter Processing>

Figure 4:
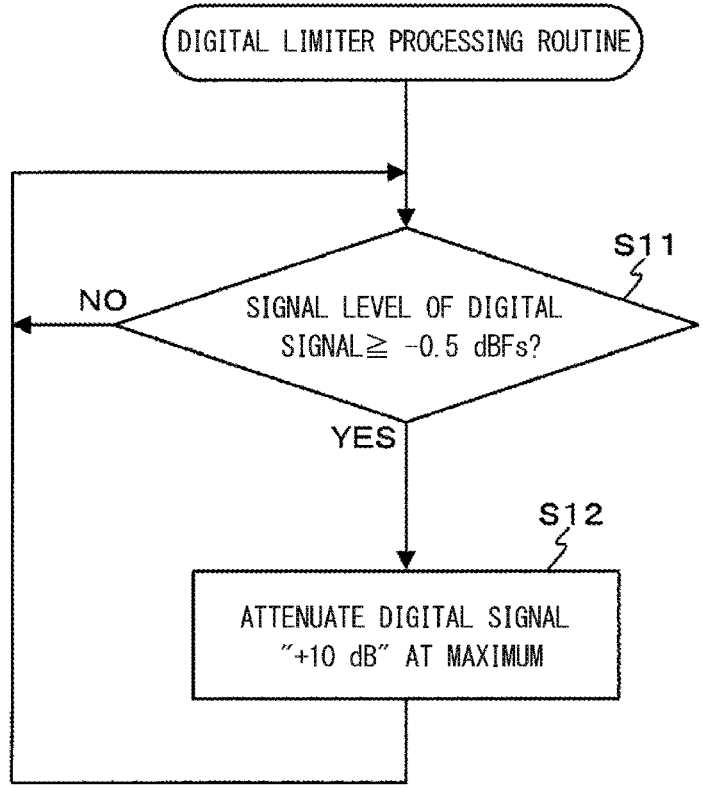
FIG. 4 is a flow chart illustrating a digital limiter processing routine performed by the digital signal processor in the present embodiment.

Then, signal limiter processing in the audio device 1 in the present embodiment is described with reference to FIGS. 2 and 4. For simplification of description on the limiter processing, the description below is given to limiter processing by the one digital limiter mechanism 33A out of the eight digital limiter mechanisms 33A through 33H. The other digital limiter mechanisms 33B through 33H also perform the limiter processing same as the description below.

As illustrated in FIG. 2, a digital signal amplified by the third amplification factor is input to the digital limiter mechanism 33A. The digital limiter mechanism 33A performs a digital limiter processing routine illustrated in FIG. 4.

Figure 7:
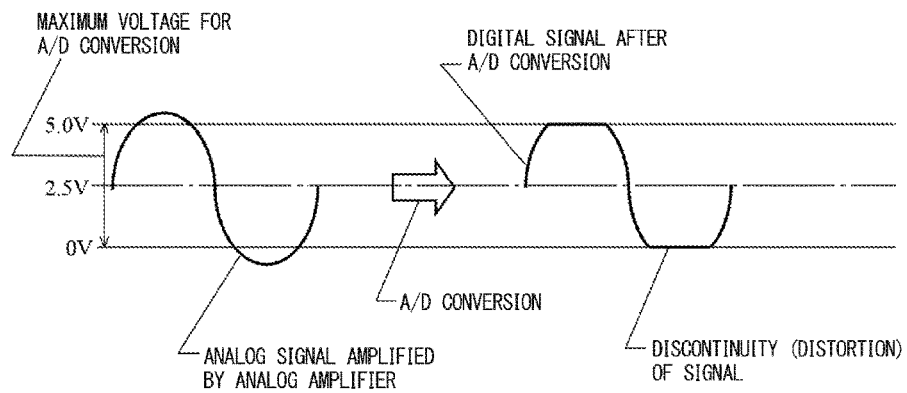
FIG. 7 is a schematic view illustrating distortion of a digital signal generated when an analog signal at an excessive signal level is A/D converted.
Figure 8:
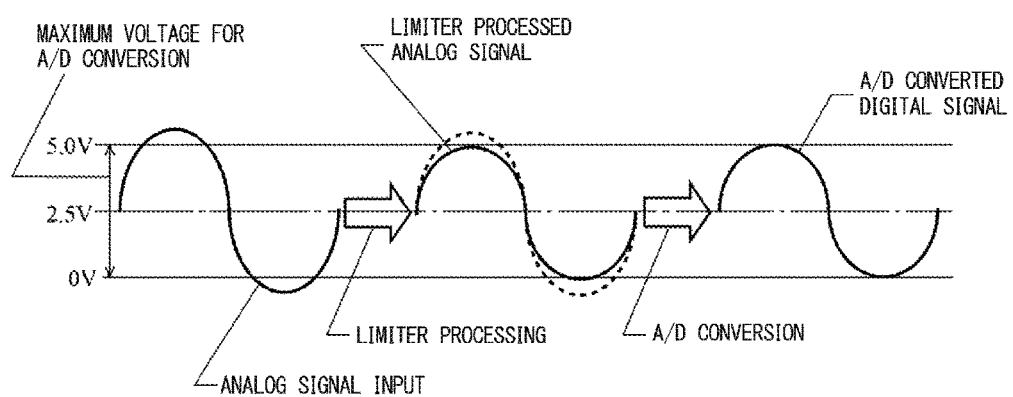
FIG. 8 is a schematic view illustrating signal processing by a limiter circuit mounted on a conventional audio device.

In step S11, the digital limiter mechanism 33A determines whether or not the signal level of the digital signal amplified by the third amplification factor is not less than a threshold defined in advance. That is, when the signal level of the digital signal amplified by the third amplification factor exceeds a signal level processable by the digital signal processor 2, discontinuous distortion is generated in the digital signal (refer to the signal waveform on the right in FIG. 7). When the signal level of the digital signal amplified by the third amplification factor is determined to be not less than the threshold defined in advance ("YES" in step S11), the digital limiter mechanism 33A then performs the process in step S12. In step S12, the digital limiter mechanism 33A attenuates the digital signal at a signal level exceeding the threshold by a predetermined attenuation factor.

Here, the threshold used for the determination in step S11 may be an upper limit of the signal level processable by the digital signal processor 2. The threshold in step S11 is set as, for example, "−0.5 dBFs". The "−0.5 dBFs" is an upper limit of the signal level processable by the digital signal processor 2 and corresponds to the maximum voltage "5.0 V" (refer to FIG. 6) that may be converted by the A/D converters 22A through 22H.

Figure 5:
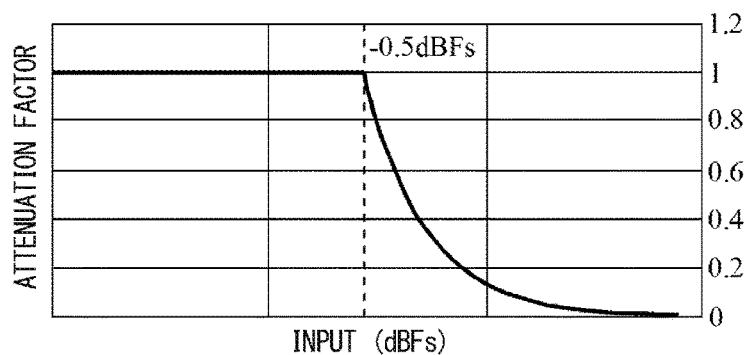
FIG. 5 is a graph illustrating input-attenuation characteristics of the digital signal processor in the present embodiment.

FIG. 5 illustrates "input-attenuation factor characteristics" when a digital signal at signal levels exceeding "−0.5 dBFs" is input to the digital limiter mechanism 33A. As illustrated in FIG. 5, the digital limiter mechanism 33A attenuates the digital signal by an attenuation factor within a range from "0" to "1" in accordance with the signal levels in the parts exceeding "−0.5 dBFs". As a result, the digital signal at signal levels exceeding "−0.5 dBFs" is attenuated "+10 dB" at maximum (step S12).

That is, when the signal level of the digital signal amplified by the third amplification factor "+10 dB" is determined to be not less than the threshold "−0.5 dBFs" ("YES" in step S11), the digital limiter mechanism 33A attenuates the digital signal by "+10 dB" at maximum (step S12). In other words, the attenuation in step S12 is performed within the range of the third amplification factor "+10 dB". When the signal level of the digital signal is not more than "−0.5 dBFs" by the attenuation in step S12, discontinuous distortion is not generated in the digital signal and the digital signal is amplified by the most appropriate amplification factor. When such process in step S12 is finished, the digital limiter mechanism 33A repeats the determination in step S11 to monitor the signal level of the digital signal.

In contrast, when the signal level of the digital signal amplified by the third amplification factor is not determined to be not less than the threshold defined in advance ("NO" in step S11), the digital limiter mechanism 33A repeats the determination in step S11 to monitor the signal level of the digital signal. When the signal level of the digital signal amplified by the third amplification factor "+10 dB" is less than the threshold "−0.5 dBFs", discontinuous distortion is not generated in the digital signal.

As illustrated in FIG. 2, the digital signals output from the digital limiter mechanisms 33A through 33H are stored in a storage mechanism, such as the SD memory card 35, for example. According to the audio device 1 in the present embodiment, in cooperation with the amplification processing and the limiter processing described above, discontinuous distortion is removed or reduced in a digital signal. As a result, in the SD memory card 35, digital signal data of good sound where noise is removed or reduced is stored.

<Backup Function>

Then, a backup function of the audio device 1 in the present embodiment is described with reference to FIG. 2.

As illustrated in FIG. 2, the four signal paths "5" through "8" corresponding to the signal input units 11E through 11H out of the eight signal paths "1" through "8" are provided with respective relays 23E through 23H. The four signal paths "1" through "4" corresponding to the signal input units 11A through 11D are selectively connectable to the signal paths "5" through "8" via the relays 23E through 23H.

Switching control of the relays 23E through 23H is performed by a switching control mechanism 34 of the digital signal processor 2. By switching the relay 23E, the connection between the signal input unit 11E and the signal path "5" is broken and the signal paths "1" and "5" are connected. Thus, the analog sound signal input from the signal input unit 11A is provided to the two signal paths "1" and "5". Similarly, by switching the relay 23F, the connection between the signal input unit 11F and the signal path "6" is broken and the signal paths "2" and "6" are connected. Thus, an analog sound signal input from the signal input unit 11B is provided to the two signal paths "2" and "6". Similarly, by switching the relay 23G, the connection between the signal input unit 11G and the signal path "7" is broken and the signal paths "3" and "7" are connected. Thus, an analog sound signal input from the signal input unit 11C is provided to the two signal paths "3" and "7". Similarly, by switching the relay 23H, the connection between the signal input unit 11H and the signal path "8" is broken and the signal paths "4" and "8" are connected. Thus, an analog sound signal input from the signal input unit 11D is provided to the two signal paths "4" and "8".

That is, in the audio device 1 in the present embodiment, by switching the relays 23E through 23H, the signal paths "5" through "8" function as backup signal paths for the signal paths "1" through "4". As described above, the signal paths "1" through "8" are connected to each one of the analog amplifiers 21A through 21H and the A/D converters 22A through 22H and the digital signals converted by the A/D converters 22A through 22H are subjected individually to digital signal processing by the digital signal processor 2. Accordingly, in the audio device 1 in the present embodiment, for example, a set value of the signal path "1" and a set value of the signal path "5", which is different from the other, are applicable to one analog signal input from the signal input unit 11A. As a result, according to the audio device 1 in the present embodiment, the SD memory card 35 is enabled to store two types of digital signal data adjusted in two different ways. In other words, recording data of the best quality of sound is more likely to be obtained. The adjustment in this context includes, in addition to the amplification processing and the limiter processing in the present embodiment described above, control and process adjustment for sound signals, such as low frequency cutoff processing and frequency characteristic correction processing (equalizing).

For example, according to the audio device 1 in the present embodiment, two types with different set values of the amplification processing and the limiter processing are applicable to one analog signal input from the signal input unit 11A. For example, by operating the amplification factor adjustment knob 12A, a user specifies a value of the first amplification factor of the signal path "1" at "+55 dB". Thus, to an analog signal input from the signal input unit 11A to the signal path "1", analog amplification processing by the second amplification factor "+45 dB", digital amplification processing by the third amplification factor "+10 dB", and limiter processing by "+10 dB" are applied. Meanwhile, by operating the amplification factor adjustment knob 12E, a user specifies, for backup, a value of the first amplification factor of the signal path "5" at "+45 dB". Thus, to an analog signal input from the signal input unit 11A to the signal path "5", analog amplification processing by the second amplification factor "+35 dB", digital amplification processing by the third amplification factor "+10 dB", and limiter processing by "+10 dB" are applied. As a result, even when distortion irremovable by the setting of the signal path "1" is generated in a digital signal, there is a possibility of removing the distortion of the digital signal by the backup setting of the signal path "5".

<Actions and Effects>

Actions and effects of the audio device 1 in the present embodiment described above are described with reference to FIGS. 2 and 6.

Figure 6:
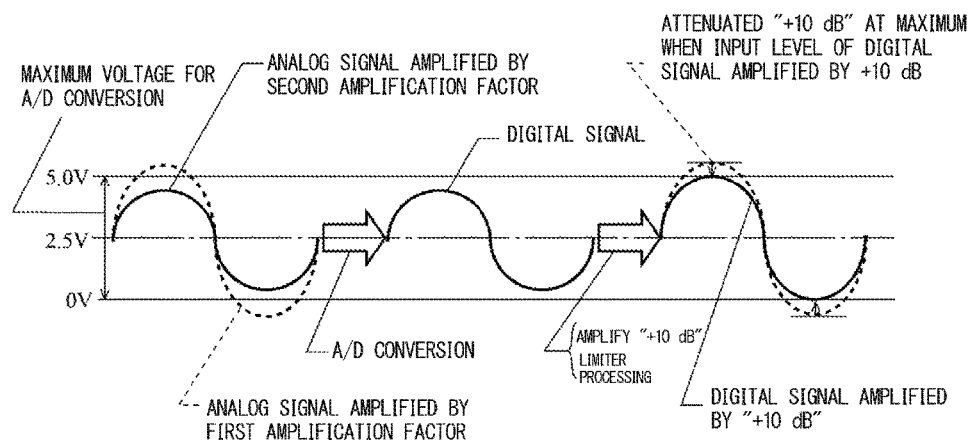
FIG. 6 is a schematic view illustrating signal processing by the digital signal processor in the present embodiment.

FIG. 6 illustrates three signal waveforms in the order of left, center, and right. The signal waveform on the left in FIG. 6 is of the analog sound signals amplified by the analog amplifiers 21A through 21H. The signal waveform at the center in FIG. 6 is of the digital signals converted by the A/D converters 22A through 22H. The signal waveform on the right in FIG. 6 is of the digital signals after subjected to the amplification processing by the digital amplifier mechanisms 32A through 32H and the limiter processing by the digital limiter mechanisms 33A through 33H.

In the audio device 1 in the present embodiment, the amplification factor setting mechanisms 31A through 31H set the amplification factors of the analog amplifiers 21A through 21H at the second amplification factor "+45 dB" lower by "+10 dB" than the first amplification factor "55 dB" specified by the amplification factor adjustment knobs 12A through 12H. Thus, as the signal waveform on the left in FIG. 6, it is possible to suppress the signal level of the analog signal, exceeding the maximum voltage for A/D conversion "5.0 V" when amplified by the first amplification factor "55 dB", to not more than the maximum voltage "5.0 V". As a result, as the signal waveform at the center in FIG. 6, discontinuous distortion in an A/D converted digital signal is prevented.

As the signal waveform at the center in FIG. 6, an A/D converted digital signal is amplified by the third amplification factor "+10 dB" by digital signal processing by the digital amplifier mechanisms 32A through 32H. As a result, the digital signal is amplified by the first amplification factor "55 dB" specified in the amplification factor adjustment knobs 12A through 12H from the sum of the second amplification factor "+45 dB" and the third amplification factor "+10 dB".

As the signal waveform on the right in FIG. 6, when the signal level of the digital signal amplified by the third amplification factor "+10 dB" is not less than the upper limit "−0.5 dBFs" of the signal level processable by the digital signal processor 2, the digital limiter mechanisms 33A through 33H attenuate the digital signal by "+10 dB" at maximum. Thus, discontinuous distortion in the final digital signal output from the digital signal processor 2 is prevented. As a result, in a storage mechanism, such as the SD memory card 35, digital signal data of good sound where noise is removed or reduced is stored.

The amplification processing and the limiter processing of the audio device 1 in the present embodiment described above are achieved by the digital signal processing functions of the digital signal processor 2. Accordingly, the audio device 1 in the present embodiment does not have to be provided with a large-scale circuit, as a conventional limiter circuit using the VCA, composed of many electrical components, such as capacitors, diodes, a transistor, operational amplifiers, and resistors.

Further, according to the audio device 1 in the present embodiment, even after the amplification processing and the limiter processing, a good S/N ratio of the digital signal is maintained.

Firstly, the influence of the limiter processing in the present embodiment on the S/N ratio is reviewed. The audio device 1 in the present embodiment performs limiter processing to a digital signal obtained by A/D converting an analog sound signal. Digital amplification processing by "+10 dB" is already applied to the digital signal subjected to the limiter processing by the digital amplifier mechanisms 32A through 32H. Even when such digital signal is attenuated by "+10 dB" at maximum by the limiter processing, it does not mean that a digital signal obtained by A/D conversion of the original analog signal is attenuated. The original analog signal is input to the A/D converters 22A through 22H at a signal level lower by "+10 dB" than the maximum voltage for A/D conversion "5.0 V". Thus, even when the signal level of the original analog signal is excessive, irreversible distortion is not generated in the A/D converted digital signal. Accordingly, the A/D converted digital signal is not distorted by the limiter processing in the present embodiment and noise is not generated from the limiter processing.

Then, the influence of the amplification processing in the present embodiment on the S/N ratio is reviewed. In the audio device 1 in the present embodiment, the original analog signal is input to the A/D converters 22A through 22H at a signal level lower by "+10 dB" than the maximum voltage for A/D conversion 5.0 V. Therefore, in the audio device 1 in the present embodiment, S (signal) becomes relatively low and N (noise) becomes relatively high during the A/D conversion.

However, an total amount $N_T$ of noise of the audio device 1 is calculated by the following equation (1). Therefore, when an amount $N_C$ of noise for A/D conversion is sufficiently low relative to an amount $N_A$ of noise included in the original analog signal, the amount of noise for A/D conversion $N_C$ does not matter. The case where the amount $N_A$ of noise included in the original analog signal becomes as low as the amount $N_C$ of noise for A/D conversion matters is when the signal level of the original analog signal is low. When the signal level of the original analog signal is low, limiter processing is not required in the first place. Accordingly, the influence of the amplification processing in the present embodiment on the S/N ratio is extremely small.

$$N_T = N_A^2 + N_C^2 \qquad (1)$$

As described above, when the A/D converters 22A through 22H have general performance, the audio device 1 in the present embodiment is capable of maintaining an S/N ratio of a digital signal extremely better than a conventional limiter circuit using the VCA.

Specific examples of the S/N ratio of the audio device 1 in the present embodiment are described below. For example, performance conditions when a first amplification factor "+55 dB" is specified by the amplification factor adjustment knobs 12A through 12H are assumed as the input-referred noise=−120 dBu and the amount of noise of the A/D converters 22A through 22H $N_C$=−100 dBu.

The amount $N_A$ of noise included in the original analog signal is calculated as follows.

$$N_A = \text{Input-Referred Noise} + \text{Amplification Factor}$$
$$= -120 \text{ dbu} + 55 \text{ db}$$
$$= -65 \text{ dbu}$$

The $N_A$=−65 dBu is referred to voltage in the following value.

$$10^{(-65/20)} \times 0.775 \times 1000 = 0.435815 \text{ mV}$$

The amount $N_C$ of noise for A/D conversion=−100 dBu is referred to voltage in the following value.

$$10^{(-100/20)} \times 0.775 \times 1000 = 0.00775 \text{ mV}$$

The total amount $N_T$ of noise of the audio device 1 becomes the following value from the following equation (1).

$$N_T = N_A^2 + N_C^2 \quad (1)$$

$$N_T = (0.435815)^2 + (0.00775)^2$$

$$= -64.9986 \text{ dBu}$$

As the above description, in the audio device 1 in the present embodiment, the total amount $N_T$ of noise=−64.9986 dBu relative to the amount $N_A$ of noise included in the original analog signal=−65 dBu, and only slight noise of 0.0014 dBu is increased. Therefore, according to the audio device 1 in the present embodiment, a good S/N ratio of a digital signal is maintained.

Further, in the audio device 1 in the present embodiment, by switching the relays 23E through 23H illustrated in FIG. 2, the signal paths "5" through "8" function as backup signal paths for the signal paths "1" through "4". Thus, two types with different set values of the amplification processing and the limiter processing are applicable to each analog signal input from the signal input units 11A through 11H.

In addition, the audio device 1 in the present embodiment is capable of performing various types of adjustment for sound signals input to the eight signal paths "1" through "8" using the menu button 14, the selection/determination knob 15, and the display panel 13 illustrated in FIG. 1A. Then, the audio device 1 in the present embodiment achieves a backup function using the four signal paths "5" through "8" as are out of the eight signal paths "1" through "8". Accordingly, the audio device 1 in the present embodiment is capable of providing a backup function that can perform various types of adjustment for sound signals without newly providing a signal path, an operation unit, and a program dedicated for backup.

<Other Modifications>

The digital processor and the audio device of the present invention are not limited to the embodiments described above. For example, the numerical values and ranges for the amplification and attenuation in the embodiments described above are all for exemplification and they may be modified appropriately when the digital processor and the audio device of the present invention are carried out. In addition, the configurations and the processing illustrated in FIGS. 1A-4 are also all for exemplification, and the configurations and the processing of the digital processor and the audio device of the present invention are not limited to FIGS. 1A-4.

DESCRIPTION OF REFERENCE NUMERALS

1 Audio Device
2 Digital Signal Processor
11A through 11H Signal Input Unit
12A through 12H Amplification Factor Adjustment Knob (Operation Unit)
13 Display Panel
14 Menu Button
15 Selection/Determination Knob
16a Recording Button
16b Play/Pause Button
16c Stop Button
16d Fast Forward Button
16e Fast Rewind Button
17a, 17b Card Slot (Connection Unit)
21A through 21H Analog Amplifier
22A through 22H A/D Converter
23E through 23H Relay
31A through 31H Amplification Factor Setting Mechanism
32A through 32H Digital Amplifier Mechanism
33A through 33H Digital Limiter Mechanism
34 Switching Control Mechanism
35 SD Memory Card (Storage Mechanism)

The invention claimed is:

1. An audio device comprising:
a signal input unit to input an analog sound signal;
an analog amplifier to amplify the analog signal;
an operation unit to specify a first amplification factor of the analog amplifier;
an A/D converter to convert the analog signal amplified by the analog amplifier to a digital signal; and
a digital signal processor to perform control of the amplification factor of the analog amplifier and processing of the digital signal converted by the A/D converter, wherein the digital signal processor comprises:
an amplification factor setting mechanism to set the amplification factor of the analog amplifier to a second amplification factor lower than a first amplification factor specified by the operation unit;
a digital amplifier mechanism to amplify the A/D converted digital signal by a third amplification factor lower than the first amplification factor; and
a digital limiter mechanism to compare a signal level of the digital signal amplified by the third amplification factor with a threshold defined in advance and attenuate the digital signal within a range of the third amplification factor based on a result of the comparison,
wherein a plurality of the analog amplifiers, the operation units, and the A/D converters are connected to the one signal input unit, and based on two or more of the first amplification factors specified by the plurality of operation units, the digital signal processor performs control of the amplification factors of two or more of the analog amplifiers and processing of each digital signal converted by two or more of the A/D converters.

2. The audio device according to claim 1, further comprising:
a storage mechanism to store digital data of the digital signal processed by the digital signal processor; or
a connection unit to the storage mechanism.

3. The audio device according to claim 1, further comprising a plurality of signal paths respectively including the signal input unit, the analog amplifiers, the operation units, and the A/D converters, wherein,
to the signal input unit of one of the signal paths, the analog amplifier, the operation unit, and the A/D converter of another signal path are selectively connected, and based on two of the first amplification factors specified by the operation units of the one and another signal paths, the digital signal processor performs control of the amplification factor of each analog amplifier of the one and another signal paths and processing two of the digital signals converted by the respective A/D converters of the one and another signal paths.

4. The digital signal processor according to claim 1, wherein the third amplification factor is a value obtained by subtracting the second amplification factor from the first amplification factor.

5. The digital signal processor according to claim 4, wherein the third amplification factor is lower than the second amplification factor.

* * * * *